United States Patent
Kadyshevitch et al.

(10) Patent No.: US 7,602,197 B2
(45) Date of Patent: Oct. 13, 2009

(54) HIGH CURRENT ELECTRON BEAM INSPECTION

(75) Inventors: Alexander Kadyshevitch, Modiin (IL); Dmitry Shur, Holon (IL); Christopher Talbot, Emerald Hills, CA (US)

(73) Assignee: Applied Materials, Israel, Ltd., Rehovot (IL)

( * ) Notice: Subject to any disclaimer, the term of this patent is extended or adjusted under 35 U.S.C. 154(b) by 344 days.

(21) Appl. No.: 10/560,205

(22) PCT Filed: Jun. 7, 2004

(86) PCT No.: PCT/US2004/018159

§ 371 (c)(1), (2), (4) Date: Aug. 7, 2006

(87) PCT Pub. No.: WO2005/001492

PCT Pub. Date: Jan. 6, 2005

(65) Prior Publication Data

US 2007/0057687 A1     Mar. 15, 2007

Related U.S. Application Data

(60) Provisional application No. 60/477,611, filed on Jun. 10, 2003.

(51) Int. Cl.
  *G01R 31/00* (2006.01)
  *G01R 31/307* (2006.01)
(52) U.S. Cl. ........................ 324/751; 324/501
(58) Field of Classification Search .............. 324/500, 324/501, 751; 250/306, 307, 310, 311
See application file for complete search history.

(56) References Cited

U.S. PATENT DOCUMENTS

| | | | | |
|---|---|---|---|---|
| 6,723,987 B2 * | 4/2004 | Ishimoto | ...................... | 250/306 |
| 6,768,324 B1 * | 7/2004 | Yamada et al. | .............. | 324/751 |
| 6,787,770 B2 * | 9/2004 | Kikuchi et al. | .............. | 250/307 |
| 6,809,534 B2 * | 10/2004 | Yamada | ...................... | 324/751 |
| 6,897,440 B1 * | 5/2005 | Yamada | ...................... | 250/306 |
| 6,946,857 B2 * | 9/2005 | Yamada et al. | .............. | 324/751 |

OTHER PUBLICATIONS

Applied Materials Israel, Ltd., International Search Report, PCT/us2004/018159, Nov. 11, 2004, 5pp.
Patent Abstracts of Japan, 2000174077, Jun. 23, 2000 1 pg.
Patent Abstracts of Japan, 2002083849, Mar. 22, 2002 1 pg.
An Inline Process Monitoring Method Using Electron Beam Induced Substrate Current, Yamada et al., 5 pp, Microelectronics Reliability, Jul. 27, 2000.

* cited by examiner

*Primary Examiner*—Ernest F Karlsen
(74) *Attorney, Agent, or Firm*—Tarek N. Fahmi

(57) ABSTRACT

A method and apparatus for wafer inspection. The apparatus is capable of testing a sample having a first layer that is at least partly conductive and a second, dielectric layer formed over the first layer, following production of contact openings in the second layer, the apparatus includes: (i) an electron beam source adapted to direct a high current beam of charged particles to simultaneously irradiate a large number of contact openings at multiple locations distributed over an area of the sample; (ii) a current measuring device adapted to measure a specimen current flowing through the first layer in response to irradiation of the large number of contact openings at the multiple locations; and (iii) a controller adapted to provide an indication of the at least defective hole in response to the measurement.

21 Claims, 10 Drawing Sheets

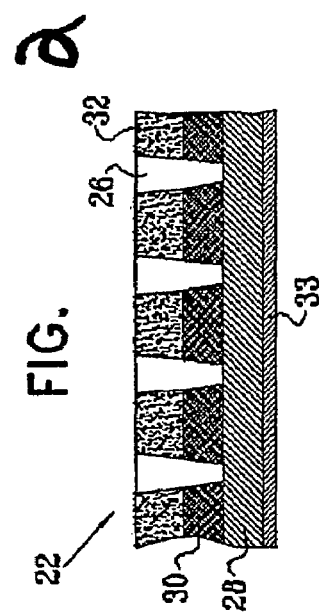
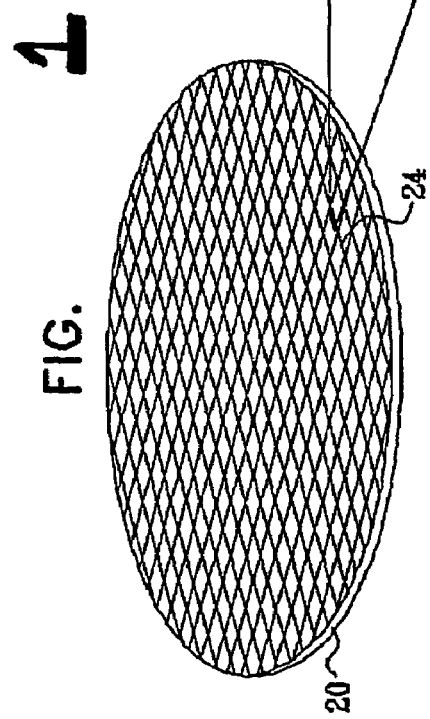
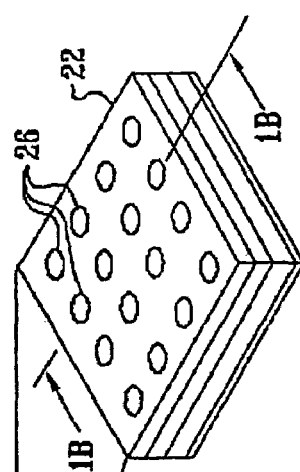

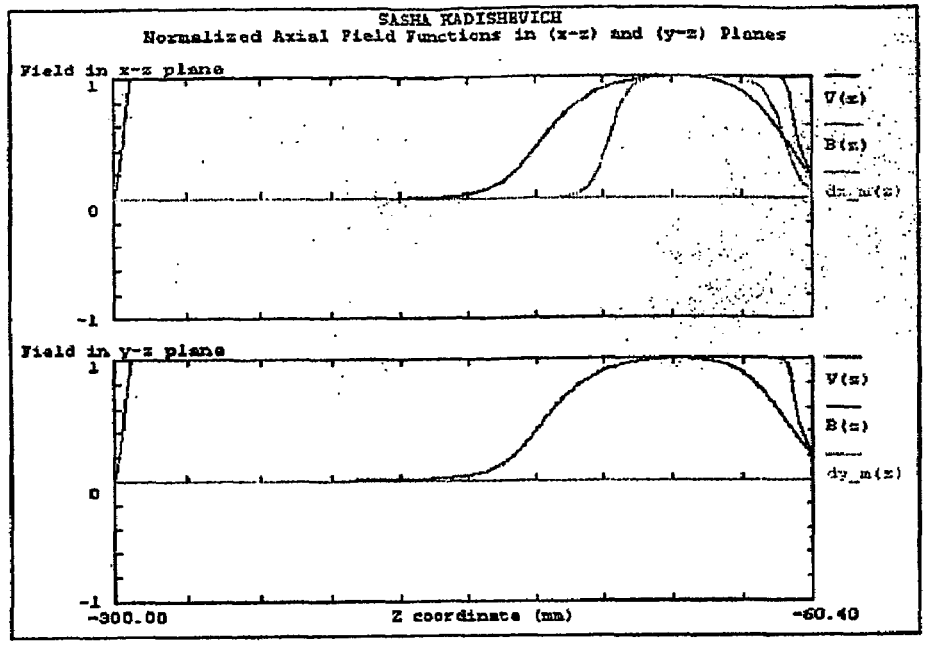
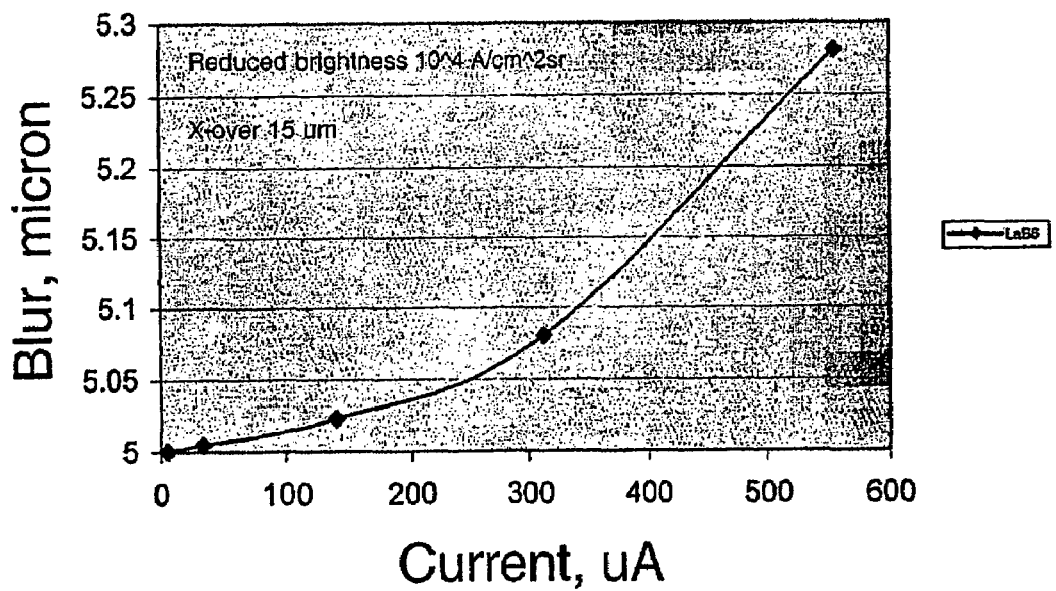
Fig. 10

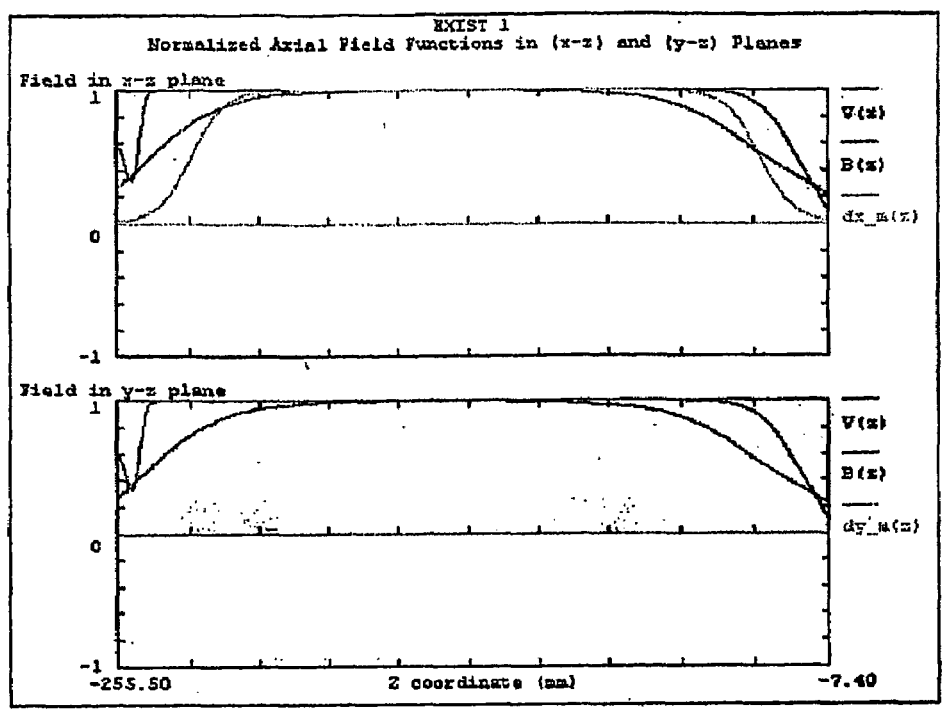
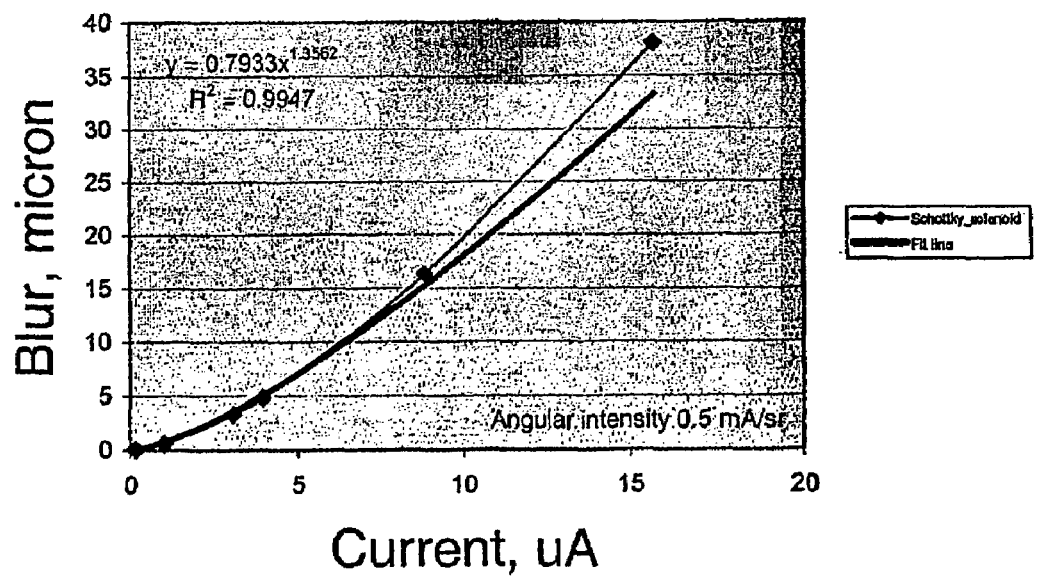
Fig. 11

HIGH CURRENT ELECTRON BEAM INSPECTION

CROSS REFERENCES TO RELATED APPLICATIONS

The present patent application is a national phase application of International Application No. PCT/US2004/018159 filed Jun. 7, 2004, which claims priority from U.S. Provisional Application No. 60/477,611 filed Jun. 10, 2003, and is herein incorporated by reference.

FIELD OF THE INVENTION

The present invention relates generally to semiconductor device manufacturing and process control, and specifically to monitoring of process quality and uniformity.

RELATED APPLICATIONS

This application is related to, claims the priority benefit of and incorporates by reference U.S. provisional patent application 60/477,611, filed Jun. 10, 2003.

BACKGROUND OF THE INVENTION

Hole production is a common step in semiconductor device manufacturing. The holes are typically used to make electrical connections to a semiconductor or metal layer through an overlying non-conducting (dielectric) layer, such as an oxide layer. In order to produce holes, a layer of photoresist is first deposited on the wafer surface. The photoresist is exposed to patterned visible or ultraviolet radiation, hardened, and developed in order to form a "mask" over the wafer, with mask patterns corresponding to hole locations. Then the wafer is transferred to an etch station where holes are formed through the dielectric layer, down to the underlying semiconductor or metallic layer. The photoresist mask is then removed, and the holes are filled with metal. A similar masking and etching process is used in producing trenches or vias in the wafer surface.

In order to ensure consistent device performance, the depth, width, and bottom surface of contact openings must be carefully controlled at various locations across the wafer surface. (In the context of the present patent application and in the claims, the term "holes" refers to all structures of the type described above, including contact openings, vias, and trenches.) Deviations in the dimensions of contact openings at a location on the wafer or across the wafer surface can lead to variations in the contact resistance. If these variations are too large, they impact on device performance and can lead to loss of process yield. The manufacturing process must therefore be carefully monitored and controlled, not only in order to detect deviations in formation of contact openings on individual devices, but also to monitor non-uniformities across the wafer surface. Early detection of process non-uniformity allows the device manufacturer to take corrective action, so as to ensure uniformly high yields and avoid the loss of costly wafers in process.

It is known in the art to use a scanning electron microscope (SEM) to inspect holes formed in a wafer. As holes are typically much deeper than they are wide, a special high aspect ratio (HAR) imaging mode is used. Usually, HAR imaging is used to measure or review hole dimensions such as top and bottom width and wall thickness. However, HAR imaging has some limitations. One limitation is that HAR imaging quality of the bottom of holes is significantly limited when the hole bottom is not connected to ground. Moreover, HAR imaging does not yield quantitative information regarding the degree of hole bottom blockage by different types of residue, such as dielectric materials, photoresist materials, etc. Consequently, the ability to control the etching process based on HAR imaging is very limited and is not quantitative.

An alternative method for hole inspection is described by Yamada et al., in "An In-Line Process Monitoring Method Using Electron Beam Induced Substrate Current," in *Microelectronics-Reliability* 41:3 (March 2001), pages 455-459, which is incorporated herein by reference. The compensation current in an electron beam system, also known as the specimen current, is defined as the absorbed current that flows from the primary electron beam to earth via the specimen (i.e., via the wafer). In other words, the specimen current is equal to the difference between the primary beam current and the total electron yield of the specimen due to secondary and backscattered electrons. The specimen current can be either positive or negative, depending on whether the energy of the primary electron beam is in the positive- or negative-charging domain of the specimen. Yamada et al. directed an electron beam at single holes and groups of holes in a silicon oxide surface layer overlying a silicon substrate, and measured the resultant compensation current. They found that the compensation current was a good indicator of hole-bottom oxide thickness, as well as of the hole diameter.

Yamada et al. describe further aspects of hole measurement in U.S. Patent Application Publication No. US 2002/0070738 A1, whose disclosure is incorporated herein by reference. Semiconductor devices are inspected by measuring the specimen current in an area of a sample having no holes as a background value, and comparing this value to the current measured in the area of a hole. The current waveform is automatically evaluated in order to determine whether the measurement is indicative of a defect of the device or of manufacturing equipment used in producing the device.

A disadvantage of some prior art current specimen based methods for assessing holes is their relatively modest throughput. In addition, the generation of very small spots is costly and requires complex tools.

SUMMARY OF THE INVENTION

The invention provides a method for wafer inspection that includes the following steps: (i) receiving a sample having a first layer that is at least partly conductive and a second, dielectric layer formed over the first layer, following production of contact openings in the second layer or even following the generation of contacts; (ii) directing a high current beam of charged particles to simultaneously irradiate a large number of contact openings at multiple locations distributed over an area of the sample; (iii) measuring a specimen current flowing through the first layer in response to irradiation of the large number of contact openings at the multiple locations; and (iv) providing an indication of the at least defective hole in response to the measurement.

The invention provides an apparatus for wafer inspection, the apparatus includes: (i) an electron beam source adapted to direct a high current beam of charged particles to simultaneously irradiate a large number of contact openings at multiple locations distributed over an area of the sample; whereas the sample has a first layer that is at least partly conductive and a second, dielectric layer formed over the first layer, following production of contact openings in the second layer; (ii) a current measuring device adapted to measure a specimen current flowing through the first layer in response to irradiation of the large number of contact openings at the multiple locations; and (iii) a controller adapted to provide an indication of the at least defective hole in response to the measurement.

According to an embodiment of the invention the method and system include die to die comparison, die to golden die comparison, and cell to cell comparison. All these method includes comparing measured currents of an inspected die to previously measured and/or processed reference current measurements.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 1 is a schematic top view of a semiconductor wafer with a pattern of contact holes formed thereon, in accordance with an embodiment of the present invention;

FIG. 2 is a schematic, sectional view of the pattern of FIG. 1, taken along a line 1B-1B;

FIGS. 10-11 illustrate various magnetic and electrical field obtained when simulating the exemplary electron gun configurations, as well as illustrates beam blur versus beam current characteristics.

DETAILED DESCRIPTION OF THE EMBODIMENTS

Figure 3B:
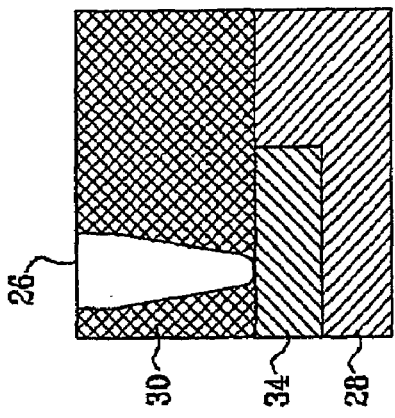
FIGS. 3A-3E are schematic, sectional illustrations of an area of a semiconductor wafer, showing a hole etched into the wafer under different process conditions.

According to various embodiments of the invention a high current charged particle beam is used for high throughput current specimen measurements. For simplicity of explanation this detailed description of the embodiments refers to electron beam while the invention can be applied to other charged particle beams including ion beams.

The inventors have found out that high throughput current specimen measurements can be achieved by illuminating a large number of holes by relatively broad spots of high current electron beams of very short duration. The short duration of each spot contributes to the high throughput and prevents damaging the sample. The high current allows to use short duration pulses while maintaining a desired (and in many cases a significant) signal to noise ratio.

For example, assuming specimen current of about 20% of the high current electron beam, a spot size of about 5×5 µm², (thus 2.5×2.5 µm²), a number of holes illuminated per spot of about 100, a sampling rate of about 16 Mpix/s, $f_{BW}$=8 MHz; an input shunt capacitance of 50 pF, and an OA equivalent noise voltage spectral density about $2nV/\sqrt{Hz}$, then a Signal to Noise Ratio (SNR) of about 7 can be obtained. By using an electron beam of about 34 µA. This intense electron beam allows to obtain a scanning rate of 1 cm²/s.

Satisfactory results (including the absence of significant sample damage) can be achieved at sampling rates that are above 14 Mpix/s spot area of 25 µm². Said high sampling rates prevent damages resulting from specimen heating and also prevent gate oxide punch-through.

The inventors found out that the SNR is responsive to a ratio between the illuminating current and inspection rate. For example, inspection rate of about 1 cm²/Sec, 0.5 cm²/sec and 0.25 cm²/sec and an illuminating current of about 10 µA resulted in SNR of about 2.2, 5 and 9.

Reference is now made to FIGS. 1 and 2, which schematically illustrate a semiconductor wafer 20 and details of a pattern 22 of holes 26 formed thereon, in accordance with an embodiment of the present invention. FIG. 1 is a top view of the wafer, with the pattern shown enlarged in an inset. FIG. 2 is an enlarged, cross-sectional view of the pattern, taken along line 1B-1B in FIG. 1. Pattern 22 may be a dedicated test pattern, for use in specimen current measurements, as described below, or it may comprise a group of production holes in a known location on wafer 20. Although only the single pattern 22 is shown in FIG. 1 by way of example, multiple patterns of this sort, distributed over the surface of wafer 20, can be used to perform specimen current measurements in various areas of a wafer. Said multiple measurements can be processed in various manners, including providing map of currents across the wafer. The pattern may also include other types of contact openings (not shown), such as trenches or vias.

In a typical application, a dielectric oxide layer 30 is formed over a conductive or semiconductor underlying layer 28, and a layer of photoresist 32 is deposited on the dielectric layer. Layer 28 may include the silicon substrate of the wafer, or it may include an intermediate semiconductor or metal layer used as a part of devices fabricated on the substrate. Holes 26 are defined by photolithography, and are then etched through layer 30 down to underlying layer 28. A measurement of the specimen current generated when pattern 22 is irradiated by a high current electron beam is indicative of the extent to which layer 28 is exposed within the holes. To facilitate specimen current measurement, a conductive contact pad 33 may be formed on the underside of wafer 20, below pattern 22.

FIGS. 3A-3E are schematic, sectional illustrations of an area of a semiconductor wafer, showing formation of hole 26 under different process conditions. In the exemplary application shown in these figures, hole 26 is meant to provide a contact to a region 34 of substrate layer 28 that contains $TiSi_2$ for enhanced conductivity. Region 34 is typically part of a gate structure, formed within layer 28 by methods known in the art. Oxide layer 30 typically includes materials such as un-doped silicon glass (USG) or boron phosphorus silicon glass (BPSG) or low-k dielectrics, with the possible addition of a nitride barrier layer (for example, $Si_3N_4$, not shown) between the silicon substrate and the glass. The structure illustrated in these figures, however, is shown solely by way of example, and holes 26 may similarly be made in and adjacent to other structures.

Figure 3A:
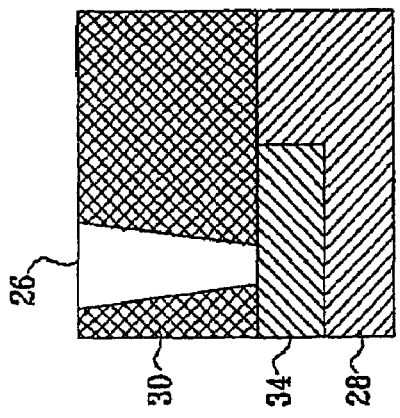

FIG. 3A shows an ideally-etched, open hole, i.e., a hole that cleanly exposes region 34, as desired. The remaining figures in this figure set show the results of different process anomalies. In FIG. 3B, hole 26 is under-etched, typically due to a problem in the etching process or in the uniformity of layer 30, for example. Consequently, the area of region 34 that is exposed at the base of hole 26 is smaller than desired. As a result, the specimen current generated when hole 26 is irradiated by an electron beam is smaller than the benchmark current generated for the ideally-etched hole shown in FIG.

3A. When the under-etched hole is filled with metal in order to contact region 34, the contact resistance may be higher than desired.

Figure 3E:
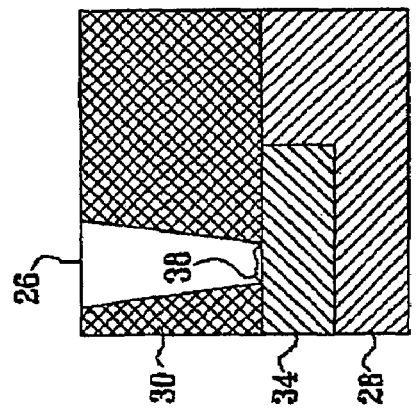
Figure 3D:
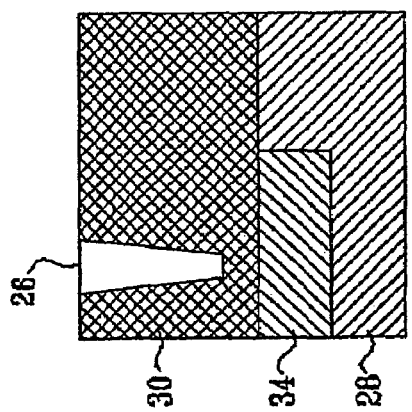
Figure 3C:
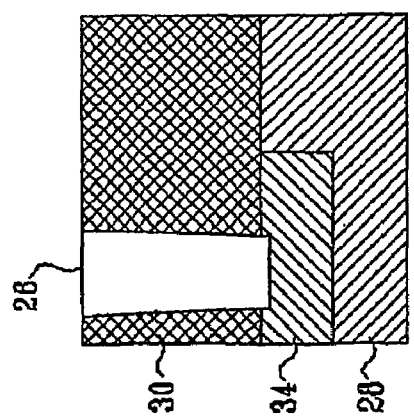

In FIG. 3C, the etching process is too strong or has continued for too much time, leading to over-etching of hole 26. In this case, the specimen current will typically be greater than in the case of FIG. 3A. Over-etching may have a deleterious effect on region 34 and on other structures, and may also lead to the deposition of contaminants at the base of hole 26. In this case, the specimen current will be smaller.

FIG. 3D shows under-etching, in which hole 26 stops short of reaching region 34, typically due to an incorrect etching process or an insufficient etching time. The measured specimen current for hole 26 in the present figure is low, and the subsequent contact resistance, following metal fill, may be substantially higher than desired.

Finally, in FIG. 3E, hole 26 is properly etched. However, a contaminant 38, such as photoresist polymer residue or dielectric residue, is deposited at the base of the hole. This contaminant typically causes a decrease in the measured specimen current as compared with the measured specimen current of an ideally etched hole, and the contaminant may cause a high contact resistance following metal fill.

In general, when a wafer is irradiated with a high current electron beam, and this process reaches equilibrium, the relationship between the specimen current ($I_{specimen}$), the high current (i.e. the current of the high current electron beam—$I_{primary}$), and the current of secondary electrons emitted from the wafer, including scattered electrons ($I_{secondary}$), is expressed by the following equation, as is known in the art:

$$I_{primary} = I_{secondary} + I_{specimen}.$$

When specimen current is measured, the surface of the wafer may be biased with a negative precharge, One effect of this pre-charge is to keep a large portion of the secondary electrons generated within the contact openings from leaving the wafer surface, thereby reducing $I_{secondary}$ and increasing $I_{specimen}$.

Referring to FIG. 3D, the sensitivity of measured $I_{specimen}$ to the thickness of residual dielectric material in layer 30 between the base of hole 26 and region 34 is related to the difference in the secondary electron (SE) yield and to the difference in conductivity between the materials of layer 30 and of region 34. Typically, the SE yield of dielectric materials is about twice the yield of semiconductor or conducting materials, for low electron beam energies, typically <1 kV. On the other hand, because of the low conductivity of the dielectric material in layer 30, the measured $I_{specimen}$ is roughly proportional to the residual dielectric thickness for holes that are slightly over-etched, and is close to zero for substantially under-etched holes. Therefore, for a given hole or group of holes in a known location on a wafer die, the measured $I_{specimen}$ is a sensitive indicator of dielectric residual thickness in the approximate range of 0 to 10 nm. Furthermore, the measured $I_{specimen}$ at the same location on different dice should be consistent over the entire wafer, and differences in the measured values may be indicative of process non-uniformities. These non-uniformities and other process defects may be detected using the methods of specimen current mapping described hereinbelow.

Figure 4:
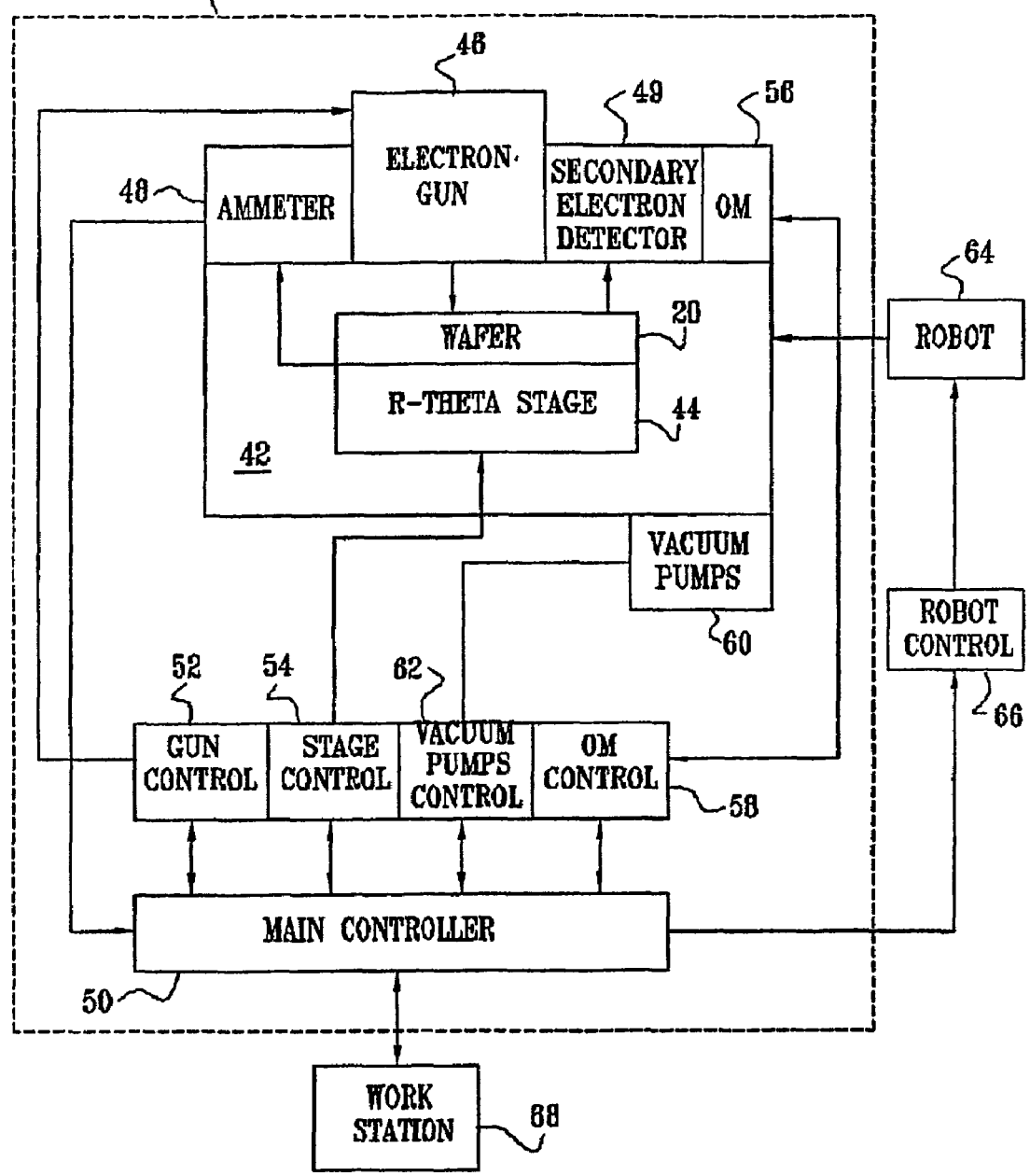
FIG. 4 is a block diagram that schematically illustrates apparatus for hole inspection and specimen current mapping, in accordance with an embodiment of the present invention.
Figure 7:
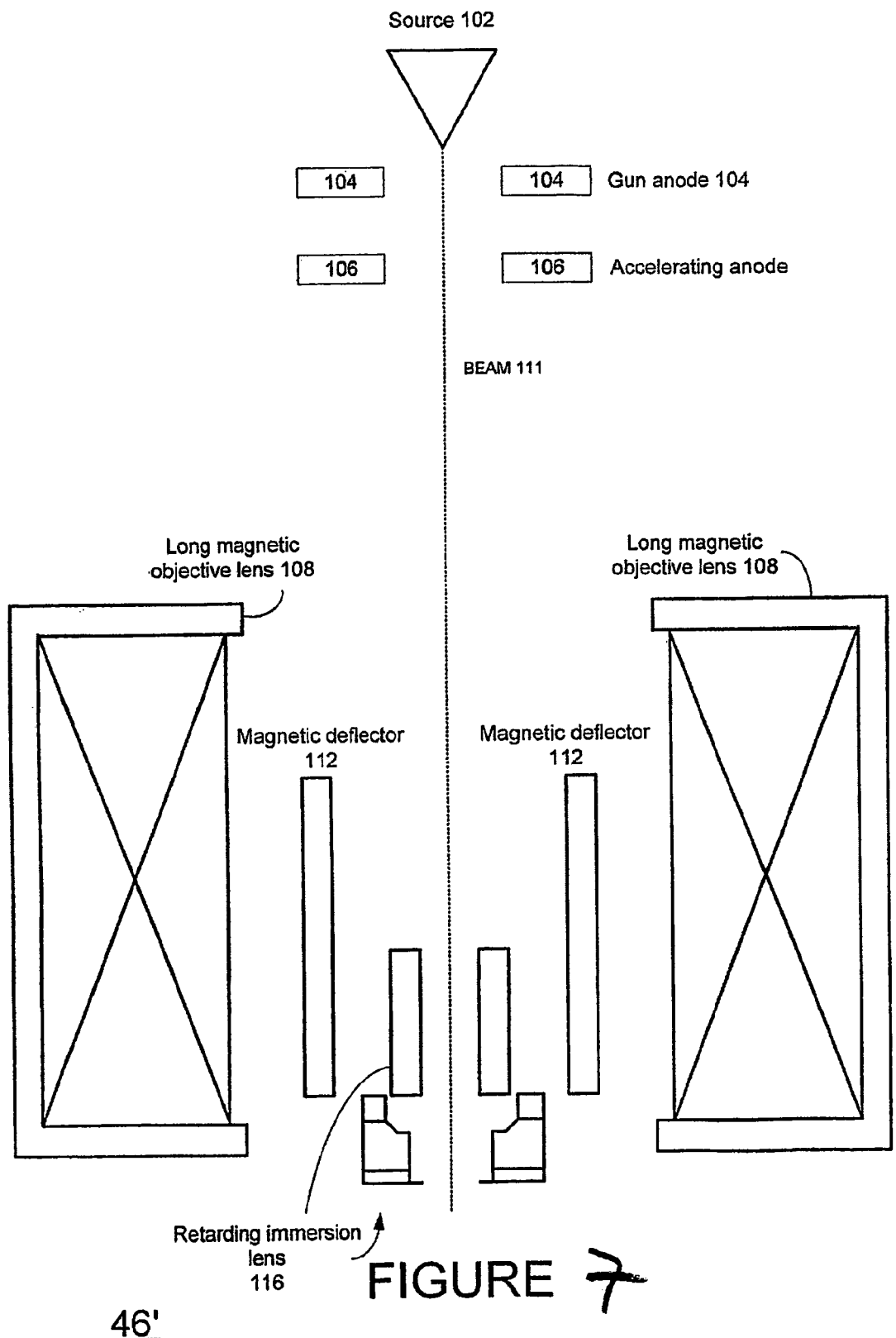
FIGS. 7-9 illustrate exemplary electron gun configurations.
Figure 8:
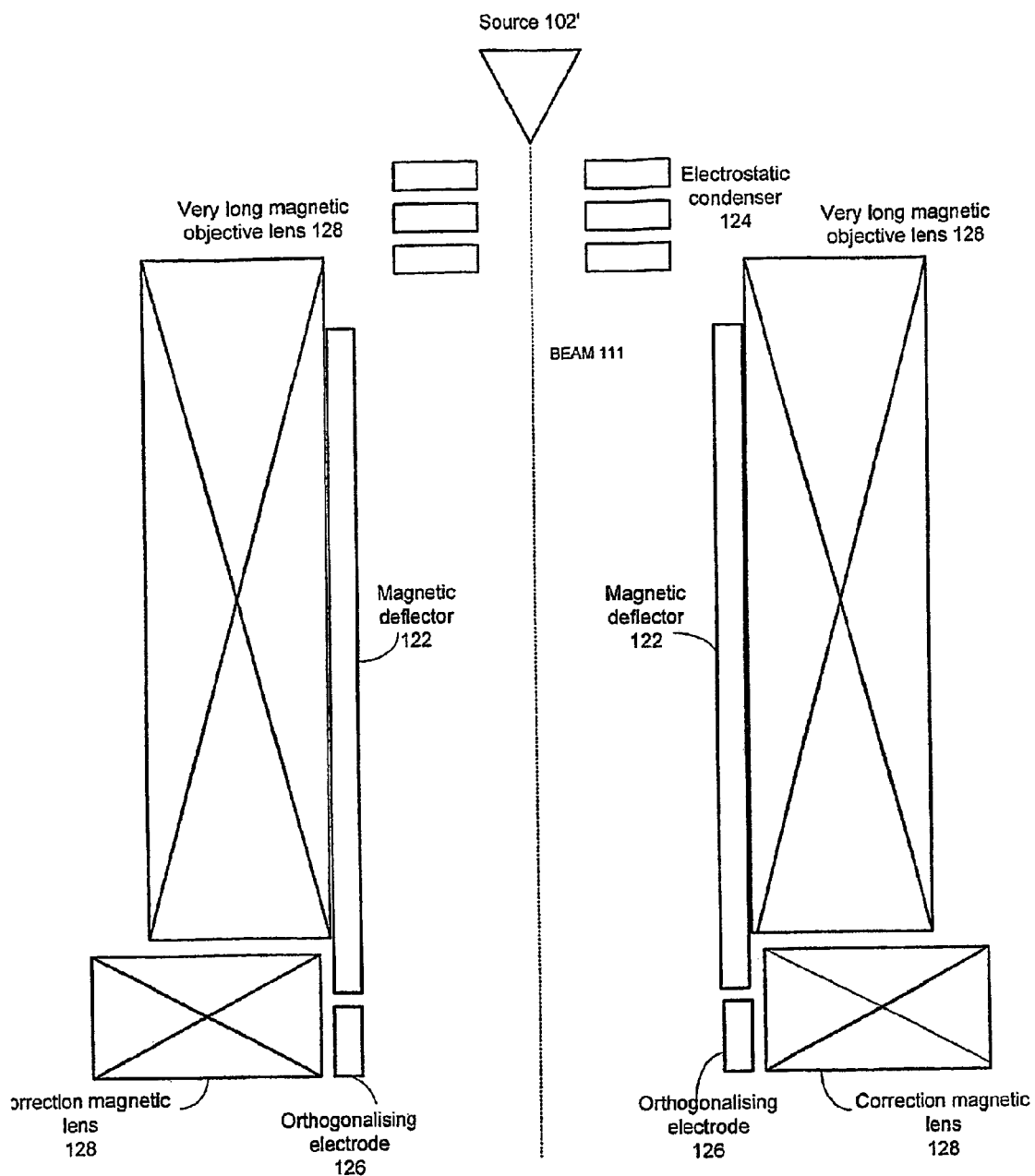
Figure 9:
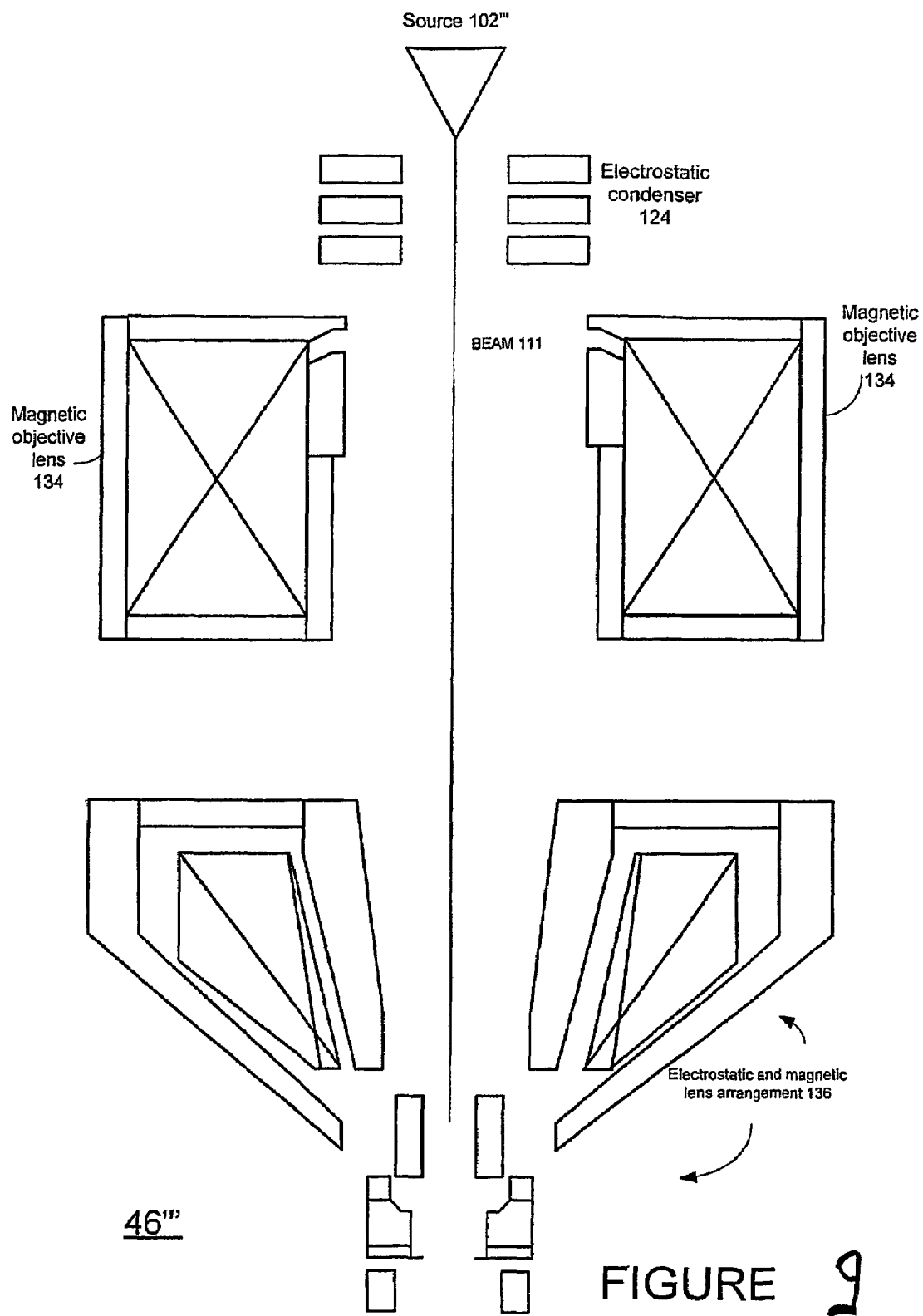

Reference is now made to FIG. 4, which is a block diagram that schematically illustrates a station 40 for hole inspection and specimen current measurements, in accordance with an embodiment of the present invention. Station 40 comprises a chamber 42, containing a motion stage 44 on which wafer 20 is placed during inspection. An electron gun 46 generates and directs a high current electron beam at wafer 20, while an ammeter 48 measures $I_{specimen}$ generated in the wafer. The high current electron beam is relatively wide (large spot) and can illuminate a large number of holes simultaneously, thus increasing the throughput of the system. Various electron guns and associated parts of station 40 are illustrated in FIGS. 7-9. The ammeter is electrically coupled to the semiconductor or conducting layer at the bottom of the holes of interest (such as layer 28, shown in FIG. 1B), optionally by means of contact pad 33.

The high current electron beam generated by gun 46 is scanned over the wafer in the region of interest. The high current beam diameter usually exceeds few microns.

Stage 44 positions wafer 20 so that a given hole or group of holes on each of a number of dice in the wafer is properly located under the high current electron beam of gun 46. Stage 44 may comprise an x-y-theta or an R-theta (translation/rotation) stage. The holes thus measured may comprise special test patterns, such as pattern 22 (FIGS. 1A and 1B), or they may, alternatively or additionally, comprise functional holes to be used in microelectronic devices fabricated on the wafer. The wafer inspection may be made on all the dice on the wafer, or only on certain, selected dice. The holes evaluated in this manner may be chosen for assessing etch quality. If desired, a number of different types of contact openings may be chosen and evaluated. It is noted that the whole wafer or die or a substantial portion of either one are scanned to locate defects, but this is not necessarily so.

After positioning stage 44 and firing gun 46 to irradiate the selected holes with the high current electron beam and, optionally, reference areas, controller 50 receives the $I_{specimen}$ values measured by ammeter 48. The controller uses these values in evaluating the status of holes which is typically displayed on a user workstation 68. According to an embodiment of the invention once a group of holes is found to include a defective hole a higher resolution measurement for determining the defective hole can be applied. Test results are evaluated and whatever corrective action may be necessary is implemented. The evaluation typically compares the measured specimen current values to benchmark values that have been established for the expected hole size, materials, etch conditions and other applicable process parameters, as well as comparing the specimen current values that have been measured on different dice across the wafer. Wafer-to-wafer comparisons of specimen current maps may also be made. The corrective action may include performing further etching, if the holes are under-etched (as shown in FIG. 2B or 2D), or removing polymer residue that may have been deposited at the bottoms of the holes (as shown in FIG. 2E). Additionally or alternatively, the corrective action may include process and alignment adjustments to the photolithography station and/or etching equipment that was used in producing the wafer currently measured.

Station 40 can operate in review mode, as well as inspection mode, by switching from a high current low resolution beam to a low current high resolution beam.

Figure 5:
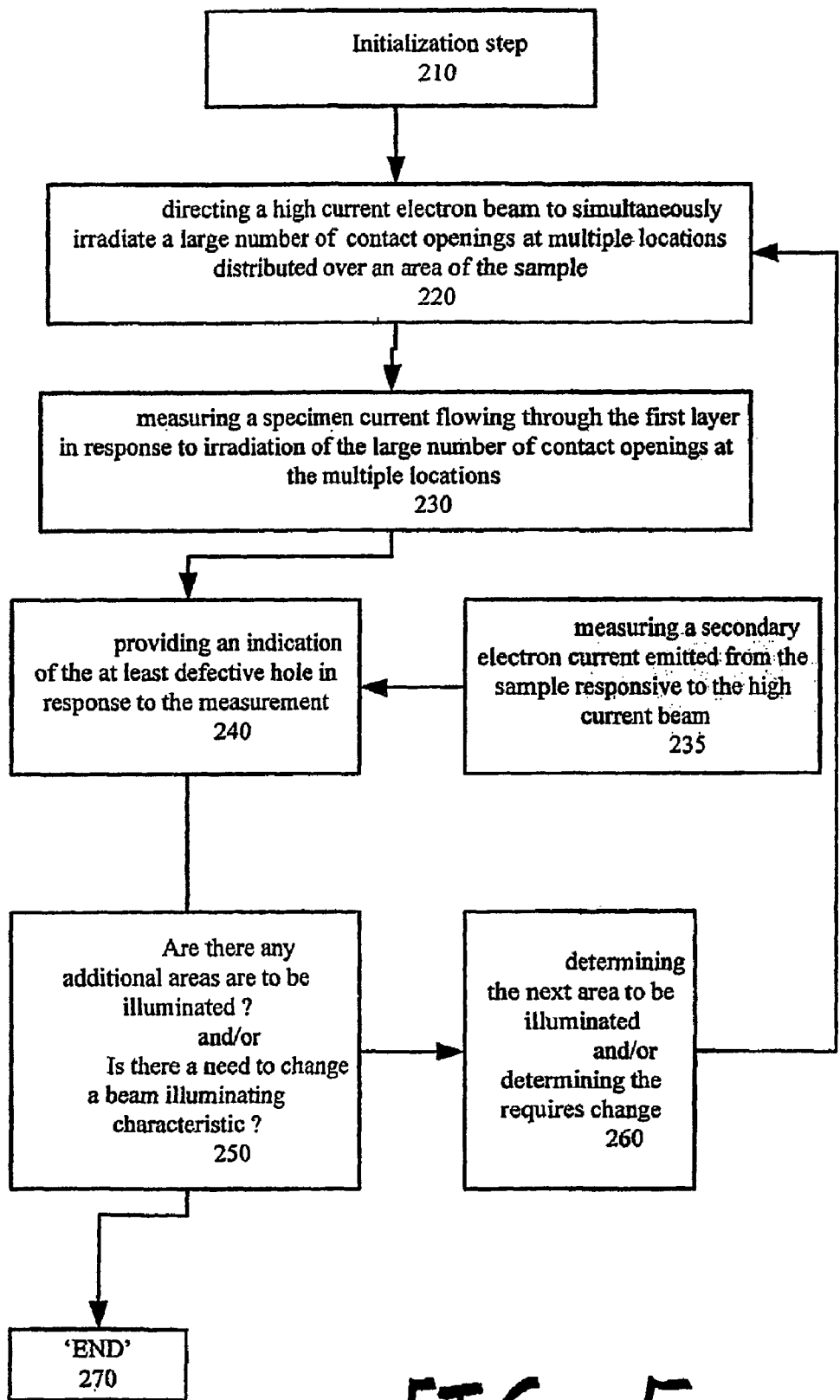
FIG. 5 is a flow chart that schematically illustrates a method for process monitoring, in accordance with an embodiment of the present invention; please ignore the PDF FIG. 5I replaced it by a new figure.

FIG. 5 is a flow chart that schematically illustrates a method 200 for process monitoring, in accordance with an embodiment of the present invention.

Method 200 starts by initializing step 210 in which a wafer 20 is provided. The wafer 20 includes multiple holes. Step 210 may include an alignment of the wafer 20 according to required scan axis, registration as well as creation of height variation map across the wafer (this map can used by the main controller 50 and the gun control unit 52 to control and predict focus current for electron gun 46 at each measurement location on the wafer). Alternatively, step 210 may include the execution of other methods known in the art may be used to control the beam focus, without the use of a focus map. As said map is usually obtained by an optical microscope step 210 may further include determining the difference in optical and electron beam focal planes (also known as focal offset). This may involve a comparison between the focal length that is measured by the optical microscope to the focal length measured by the SEM. The focus offset is the difference between the two measurements.

Step 210 is followed by step 220 of directing a high current electron beam to simultaneously irradiate a large number of contact openings at multiple locations distributed over an area of the sample. This area is usually determined by a controller or tool user and it is usually located by a area location process that may involve a mechanical and/or electrical displacement to an estimated location that is followed by an image recognition based location step.

The size of the illuminated area is responsive to the spot size of the high current electron beam. This size can be increased or decreased in accordance to throughput requirements on one hand and signal to noise ratio requirements on the other. The spot size can be altered in response to various parameters including the density of hole arrays, the required intensity of current change that may indicate that there is a defective hole, hole cross section deviations that are regarded as defects, and the like. The method may include setting the characteristics of a high current electron beam to certain values, evaluating the measurements obtained while using said values, and then determining whether to alter these values. For example if desired SNR can be obtained with a larger spot size the spot size can be incremented to improve throughput. On the other hand, if the SNR is not high enough the spot size can be decreased.

Step 220 is followed by step 230 of measuring a specimen current flowing through the first layer in response to irradiation of the large number of contact openings at the multiple locations. High-bandwidth current measurement device is required to achieve high throughput.

Step 230 is followed by step 240 of providing an indication of the at least defective hole in response to the measurement. The indication can be responsive measured specimen current values that indicate that at least one hole was at least partially (or even substantially) blocked.

According to an aspect of the invention method 200 further includes step 235 of measuring a secondary electron current emitted ($I_{secondary}$) from the sample responsive to the high current electron beam. Step 235 is followed by step 240 that may provide an indication in response to $I_{secondary}$ and $I_{specimen}$ or, in response to the difference between said two values.

According to another embodiment a reference current $I_{reference}$ can be measured by illuminating an area that does not include contact holes, and is located in proximity with the illuminated area. This current can be subtracted from $I_{specimen}$.

Step 240 is followed by step 250 of determining whether additional areas are to be illuminated. Additionally or alternatively step 250 may include determining whether there is a need to alter one of the high current beam characteristics. If at least one of said determinations is positive then step 250 is followed by step 260 of determining the next area to be illuminated and/or altering the beam characteristic and jumping to step 220. Else—step 250 is followed by 'END' step 270. The next area can be determined in response to a predetermined scanning scheme (such as raster scan scheme). The different illuminated areas may partially overlap, but this is not necessarily so.

According to another embodiment of the invention stage 240 includes comparing measured currents to previously measured currents or and additionally or alternatively, previously processed measured currents fro another die (die to die comparison), from a statistical representation or previously measured currents or estimated currents (die to golden die) or from measurement of ideally identical cells (also referred to repetitive patterns).

Each measurement may be associated with a location. Once both measurements and their associated locations are retrieved a map of current specimen can be generated. This map may be generated at step 270, but this is not necessarily so. An exemplary map is illustrated at FIG. 6.

Figure 6:
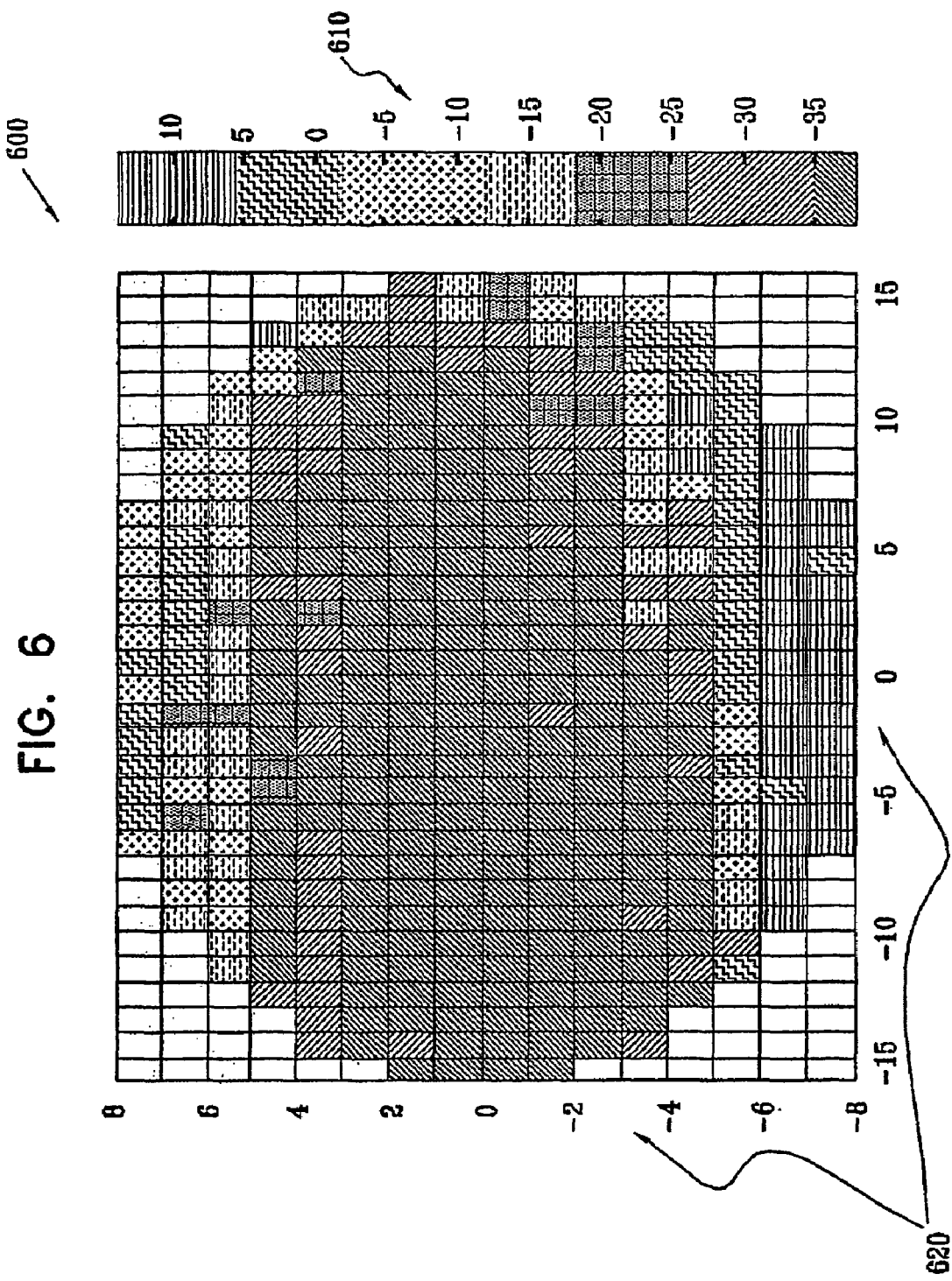
FIG. 6 is a schematic illustration of a current specimen map.

FIG. 6 is a schematic representation of a specimen current map 600, showing the specimen current measured at multiple locations across wafer 20, in accordance with an embodiment of the present invention. A key 610 shows a range of specimen currents versus shading gradations. (Typically, key 610 shows color shading.) Axes 620 represent dice or other convenient coordinate location indicators. Corresponding specimen currents are indicated with appropriate shading at respective locations on the map. In map 600, one specimen current value is shown for each wafer die. Alternatively, more or fewer specimen current values may be shown on map 600. Although map 600 is shown as a graphic representation, it may be alternately or additionally maintained as a numerical representation, such as in vectorial form.

As shown in map 600, the magnitude of the specimen current across most of the dice on the wafer was high (i.e., strongly negative). On the upper and lower edges of the wafer, however, much lower specimen current magnitude was measured. These low values may be indicative, for example, of non-uniformity in the etch process or of contact misalignment. The form of map 600 typically gives an indication of the type of process defect involved, so that appropriate corrective steps can be taken.

The map can be compared to anther map during various comparison methods. The comparison can include generating a difference map and comparing said difference to one or more thresholds. The difference map, one or the compared maps and the threshold or either to the above can be displayed to the user.

Various embodiments of the inventions were simulated by the inventors. The first embodiment includes a $LaB_6$ electron source 102. Said electron source 102, as well as other parts of electron gun 46' are illustrated in FIG. 7. The $LaB_6$ electron source can be replaced by an equivalent electron source (such as other thermo-ionic sources) without departing from the scope of the invention.

Nevertheless, the inventors found that using an $LaB_6$ electron source has various advantages. It provides a relatively high total current with reasonable source brightness as well as reasonable stability. Thermo-ionic cathodes have is a large source size that is limited to 10-20 μm. Thus, using these thermo-ionic sources requires an electron optical de-magnification of the source size to reach spot size of ~5 μm in the image plane. The de-magnification can arise spherical and off-axis aberrations minimization issues.

Electron gun 46' includes $LaB_6$ electron source 102 that is followed by gun anode 104, accelerating anode 106, long magnetic objective lens 108, magnetic deflectors 112 and retarding immersion lens 116. The magnetic deflectors 112 are positioned in parallel to the optical axis of electron beam system through which the high current electron beam (denoted BEAM 111) propagates and between the long magnetic objective lens 108 and between the retarding immersion lens 116.

Gun anode 104 is operable to adjust an electron lens that includes elements 102, 104 and 106. It allows to control an electric filed at the vicinity of electron source 102. The accelerating Anode 106 allows to reach high acceleration ratio of the electrostatic lens to reduce aperture angle and corresponding aberrations. The long magnetic objective lens 108 provides required source size demagnification minimizing spherical and off-axis aberrations. Provides homogenous spot focusing through entire deflection field as well as beam orthogonalization. The magnetic deflector 112 deflects the beam outwards the optical axis. The retarding immersion lens 116 provide final focusing of the electron beam spot, deceleration to low energies, and orthogonalization together with 108.

At an exemplary configuration in which the distance between exit aperture of the retarding immersion lens 116 and the tip of the electron source 102 is 70 mm, the electron source 102 is at potential of 50V, the gun anode is at a potential of 300V potential and the accelerating anode 106 accelerates the high current electron beam 111 up to 10 keV various electrostatic and magnetic fields were obtained. They are illustrated in FIG. 10. These fields focus electrons of 10 keV and de-accelerate them to a much smaller landing energy (of about 1 keV).

This configuration de-magnifies a 15 µm virtual source provided by electron source 102 to produce a 5 µm first order blur at the image plane on irradiated the sample. Aberration spot blur is about 1.7 µm whereas beam deflection is about ±0.28 mm. Assuming that the current of the high current electron beam is 34 µA, a cross-over diameter of 15 µm and aperture semi-angle of 100 mrad, then the brightness of the electron source is about $6 \cdot 10^2$ A/(cm$^2$·strad). This can be achieved by well known LaB$_6$ electron sources.

FIG. 10 illustrates the relationship between the current of the high current electron beam and the blur that can be obtained using the configuration of FIG. 7. The spherical aberration blur is rather small compared to first order geometrical blur (5 µm for given de-magnification).

A second embodiment includes a Schottky electron source 102". Said electron source 102", as well as other parts of electron gun 46" are illustrated in FIG. 8.

Electron gun 46" includes Schottky electron source 102" that is followed by electrostatic condenser 124, very long magnetic objective lens 128, long magnetic deflectors 122 and orthogonalsing electrodes 126 as well as correction magnetic lens 128. The electrostatic condenser 124 is used as the first lens of the electron gun 46" to decrease high aperture angle electrons emitted from electron source 102". The very long magnetic objective lens 128 is used to prevent off-axis shift of the electron beam. The electrons from electron source 102" are typically extracted to a rather high energy of about 5 keV. This is lower then the energy of electrons of the first embodiment that can be accelerated to energies that exceed 10 keV.

The Electrostatic (magnetic) condenser 124 is operabvle to de-magnify aperture angle to minimize aberrations. The very long magnetic objective lens 128 provides homogenous focusing through entire deflection field with minimizing spherical and off-axis aberrations. The magnetic deflector 122 deflects the beam outwards the optical axis. The orthogonalizing electrode 126 and correction magnetic lens 128 combine electrostatic and magnetic fields for homogenous orthogonalization of the beam providing deceleration and minimizing aberrations. May be used for dynamic orthogonalization and spot size adjustment.

The spot size of the high current electron beam is limited by spherical aberration blur, as expected from a high current electron beam of high aperture angle at object plane. The inventors found out that due to various reasons (including current limitations, spherical aberrations, blur and the like) this configuration may provide lower throughput than the LaB$_6$ electron source 102. An aperture semi-angle in the object plane of 75 mrad will result in spot size in the image plane of about 8 µm (16.3 µm beam blur) and current of about 9-18 µA for an angular intensity of 0.5-1 mA/sRad. Lower current require longer acquisition time thus reducing the throughput.

FIG. 11 illustrates the relationship between the current of the high current electron beam and the blur that can be obtained using the configuration of FIG. 8. The total blur consists of spherical aberration blur. Sub-micron spot size can be achieved just by limiting beam aperture angle at the object plane. This is a very important advantage of the Schottky cathode based concept. Ease of switching between "low resolution—high current" and "high resolution—low current" modes is a solution for precise registration in the wafer current inspection system as well as for review mode.

According to a third embodiment an electron gun 46" is a modification of a low current high resolution electron gun device. Said embodiment is illustrated in FIG. 9. The Schottky electron source 102''' is followed by electrostatic condenser 124, a first magnetic objective lens 134, and electrostatic and magnetic lens arrangement 136 that includes a magnetic lens as well as a retarding immersion electrostatic lens. The modification included removal of various beam limiting apertures for utilizing electrons emitted at a large range of angles (in respect to the optical axis) as well as the introduction of various components such as the condenser 124.

The spot size is limited by spherical aberration, as it was seen for previous embodiments. A beam blur of about 14.1 µm was achieved for an aperture semi-angle in the object plane of 65 mrad. A electron source of an angular intensity of 0.5-1 mA/strad a current of about 6.6-13.3 µA is achieved. This current level is lower than achieved by a previously mentioned configuration with a comparable spot size.

The electrostatic condenser 124 de-magnifies the beam aperture angle to avoid high aberrations. Provides flexible beam current adjustment. The magnetic objective lens 134 reduces spherical aberration coefficient of the electron optical system. The electrostatic condenser 124 and magnetic objective lens 134 provide complex projection system for minimizing the spherical aberration. The electrostatic and magnetic lens arrangement 136 provide homogenous spot focusing through entire deflection field, deflection, orthogonalization, and deceleration to low beam energies.

Although the embodiments described hereinabove are directed particularly to hole monitoring, and especially for inspecting substantial parts of the wafer, the principles of the present invention may also be applied to other quality control tasks. Wafer current based inspection values may be useful in monitoring etching and lithography steps, as well as deposition (including material thicknesses measurements for ultra thin films), and photoresist application and uniformity. Especially, gate oxide thickness measurement and capacitor thickness measurement for DRAM. The methods of the present invention provide an indication both of the width of such features and of the thickness of layers making up the features. These methods can be adapted for use not only before metal deposition, as in the embodiments described above, but also after metal deposition to inspect contacts, interconnects and metal lines for potential disconnects, short circuits, and other defects. Test station 40 may be integrated into a cluster tool for in-line monitoring of parameters described hereinabove.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

We claim:

1. A method for wafer inspection, comprising:
    inspecting a sample at an inspection rate 'R', said sample having a first layer that is at least partly conductive and a second, dielectric layer formed over the first layer said second layer having production contact openings formed therein, said inspecting step comprising;
    directing a beam of charged particles, said beam having a beam current '$I_b$' and a spot area 'A1', to simultaneously irradiate an area of the sample, said area comprising a quantity 'n' of said contact openings, said openings being disposed within an area smaller than A1;
    measuring a specimen current flowing through the first layer in response to said beam; and
    providing an indication, in response to the measurement, of whether any hole in quantity 'n' is defective, wherein
        $I_b$ is approximately 10 µamps, R is at least 0.2 cm$^2$/sec, area A1 is approximately 25 µm$^2$, and an average noise current per contact opening is less than 9 nA.

2. The method of claim 1 wherein the quantity n is approximately one hundred.

3. The method according to claim 1 wherein the steps of directing and measuring are repeated at a frequency greater than 2 MHz.

4. The method according to claim 1 wherein the high current beam is characterized by a large cross section and the step of directing comprises compensating for aberrations.

5. The method according to claim 4 wherein the high current beam comprises electrons emitted over a large angular range in relation to an optical axis of the high current beam.

6. The method of claim 1 wherein the step of compensating comprises propagating the high current beam through a long magnetic lens.

7. The method of claim 1 further comprises measuring a secondary electron current emitted from the sample responsive to the high current beam, and wherein the indication is further responsive to the measured secondary electron current.

8. The method of claim 1 wherein the step of providing an indication is followed by a step of locating the at least one defective hole.

9. The method of claim 8 wherein the step of locating comprises directing a high resolution beam towards the at least one defective hole.

10. The method according to claim 1, wherein the contact openings comprise holes.

11. The method according to claim 1, wherein the contact openings comprise trenches.

12. The method of claim 1 wherein area of different directing sessions overlap.

13. The method of claim 1 herein repeating the steps of directing and providing to illuminate multiple areas of the wafer.

14. The method of claim 1 further comprising a step of estimating a signal to noise ratio associated with the high current beam and altering at least one characteristics of the high current beam in response.

15. The method of claim 14 wherein the at least one characteristic is selected from the group consisting of beam current and spot size.

16. The method according to claim 1 wherein the steps of directing and measuring are repeated until at least a substantial sized portion of the wafer is irradiated by the high current beam.

17. The method of claim 1 wherein the stage of providing an indication is responsive to previously measured currents.

18. The method of claim 1 wherein the stage of providing an indication is responsive to previously estimated currents.

19. The method of claim 1 wherein the stage of providing an indication comprises applying die to die comparison.

20. The method of claim 1 wherein the stage of providing an indication comprises applying die to golden die comparison.

21. The method of claim 1 wherein the stage of providing an indication comprises applying cell to cell comparison.

* * * * *